United States Patent
Yu

(10) Patent No.: US 6,630,385 B1
(45) Date of Patent: Oct. 7, 2003

(54) MOSFET WITH DIFFERENTIAL HALO IMPLANT AND ANNEALING STRATEGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,773

(22) Filed: Apr. 27, 2001

(51) Int. Cl.$^7$ .................. H01L 21/336; H01L 21/425
(52) U.S. Cl. ............... 438/289; 438/514; 438/519; 438/528; 438/530
(58) Field of Search ............... 438/289–307, 438/520, 519, 514, 526–530, 535, 525; 257/335, 336, 328, 344, 408, 900

(56) References Cited

U.S. PATENT DOCUMENTS

| | | | | |
|---|---|---|---|---|
| 4,683,645 A | * | 8/1987 | Naguib et al. | 148/DIG. 140 |
| 5,804,496 A | * | 9/1998 | Duane | 438/520 |
| 5,849,615 A | * | 12/1998 | Ahmad et al. | 438/231 |
| 5,885,886 A | * | 3/1999 | Lee | 438/528 |
| 5,937,293 A | * | 8/1999 | Lee | 257/336 |
| 5,953,615 A | * | 9/1999 | Yu | 438/305 |
| 6,046,472 A | * | 4/2000 | Ahmad et al. | 257/336 |
| 6,096,586 A | * | 8/2000 | Milic-Strkalj et al. | 257/402 |
| 6,194,293 B1 | * | 2/2001 | Krivokapic | 438/302 |
| 6,211,027 B1 | * | 4/2001 | Lin et al. | 438/303 |
| 6,215,151 B1 | * | 4/2001 | Wu et al. | 257/204 |
| 6,218,226 B1 | * | 4/2001 | Lin et al. | 257/357 |
| 6,242,312 B1 | * | 6/2001 | Huang et al. | 438/305 |
| 6,255,219 B1 | * | 7/2001 | Xiang et al. | 438/705 |
| 6,268,640 B1 | * | 7/2001 | Park et al. | 257/288 |
| 6,281,556 B1 | * | 8/2001 | Gerritsen et al. | 257/382 |
| 6,287,920 B1 | * | 9/2001 | Chatterjee et al. | 438/276 |
| 6,294,433 B1 | * | 9/2001 | Luning | 438/301 |
| 6,353,245 B1 | * | 3/2002 | Unnikrishnan | 257/336 |

* cited by examiner

Primary Examiner—W. David Coleman
Assistant Examiner—Brook Kebede
(74) Attorney, Agent, or Firm—LaRiviere, Grubman & Payne, LLP

(57) ABSTRACT

A method for improving the channel doping profile of deep-submicron field effect transistors and MOSFETs. The method involves dual halo implants annealed at different temperatures to improve the threshold voltage roll-off characteristics of MOSFETs of approximately 50 nm or less. The method includes a deep source/drain implant and anneal, followed by an angled deep halo implant and a second anneal at a lower temperature. An amorphization implant is then made, followed by a second angled halo implant, formation of source/drain extensions and a third anneal at a temperature less than the second anneal.

16 Claims, 5 Drawing Sheets

MOSFET WITH DIFFERENTIAL HALO IMPLANT AND ANNEALING STRATEGY

CROSS-REFERENCE TO RELATED APPLICATIONS

This application is a continuation application of, and claims priority from, co-pending U.S. patent application Ser. No. 09/844,773, also entitled MOSFET WITH DIFFERENTIAL HALO IMPLANT AND ANNEALING STRATEGY, filed Apr. 27, 2001, in turn, related to the following commonly assigned patent applications by the same inventor:

(1) U.S. patent application Ser. No. 09/844,854, entitled A PROCESS METHOD TO FABRICATE MOSFET WITH DUAL HALO IMPLANT, filed Apr. 27, 2001;

(2) U.S. patent application Ser. No. 09/844,753, entitled DUAL HALO IMPLANT FABRICATION METHOD FOR A MOSFET AND DEVICES FABRICATED THEREFROM, filed Apr. 27, 2001; and (3) U.S. patent application Ser. No. 09/844,853, entitled DUAL HALO IMPLANT DISPOSABLE SPACER INTEGRATION METHOD FOR FABRICATING A MOSFET AND DEVICES FABRICATED THEREFROM, filed Apr. 27, 2001.

FIELD OF THE INVENTION

The present invention relates generally to field effect transistor fabrication, and most particularly to engineering of the channel under the transistor to counter short field effects in deep-submicron complementary (CMOS) field effect transistors on the same chip.

DESCRIPTION OF THE BACKGROUND ART

When MOSFET gate length is scaled below 100 nanometers (nm), short channel effects become significant factors. Strong or higher implant dose halo implants are widely used in deep submicron CMOS technology to engineer the FET channel to overcome short channel effects. Strong halo implants however, tend to degrade channel mobility, resulting in low device drive current. The usual single halo implant is not sufficient to control threshold voltage ($V_{th}$) roll-off at approximately 50 nm gate lengths or smaller. What is needed is a method to engineer the channel doping profile to overcome the short channel effects in deep submicron CMOS chips having gate lengths of approximately 50 nm or less.

BRIEF SUMMARY OF THE INVENTION

The present invention is a method for improving the channel doping profile of deep-submicron field effect transistors and MOSFETs. By way of example, and not of limitation, the method involves dual halo implants annealed at different temperatures to improve the threshold voltage roll-off characteristics of MOSFETs of approximately 50 nm or less. The method involves a deep source/drain implant and anneal, followed by an angled deep halo implant and a second annealing at a temperature lower than the first anneal. An amorphization implant is then made, followed by a second angled halo implant, formation of source/drain extensions and a third anneal at a temperature less than the second anneal. The microelectronic chip is then silicided and the MOSFET is further completed.

The resultant device operates at an increased speed compared to similar heretofore known devices. The instant method improves device density on the substrate and improves manufacturing precision and efficiency. Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the device and method generally shown in FIG. 1 through FIG. 5. It will be appreciated that the device may vary as to configuration and as to details of the components, and that the method may vary as to the specific steps and sequence, without departing from the basic concepts as disclosed herein.

The present invention method for improving the channel doping profile of deep-submicron field effect transistors and MOSFETs involves dual halo implants annealed at different temperatures to improve the threshold voltage roll-off characteristics of MOSFETs of 50 nm or less. The method involves a deep source/drain vertical implant and annealing at a first temperature, followed by an angled deep halo implant and annealing at a second temperature. The second, lower temperature is made possible by removal of a spacer after the source/drain implant but before the first halo implant. An amorphization implant is then made, followed by a second angled halo implant, formation of source/drain extensions and a third halo anneal at a temperature less than the second halo anneal. This differential thermal annealing strategy for each halo implant results in a multi-graded lateral channel doping profile and improved threshold voltage roll-off characteristics.

Figure 1:
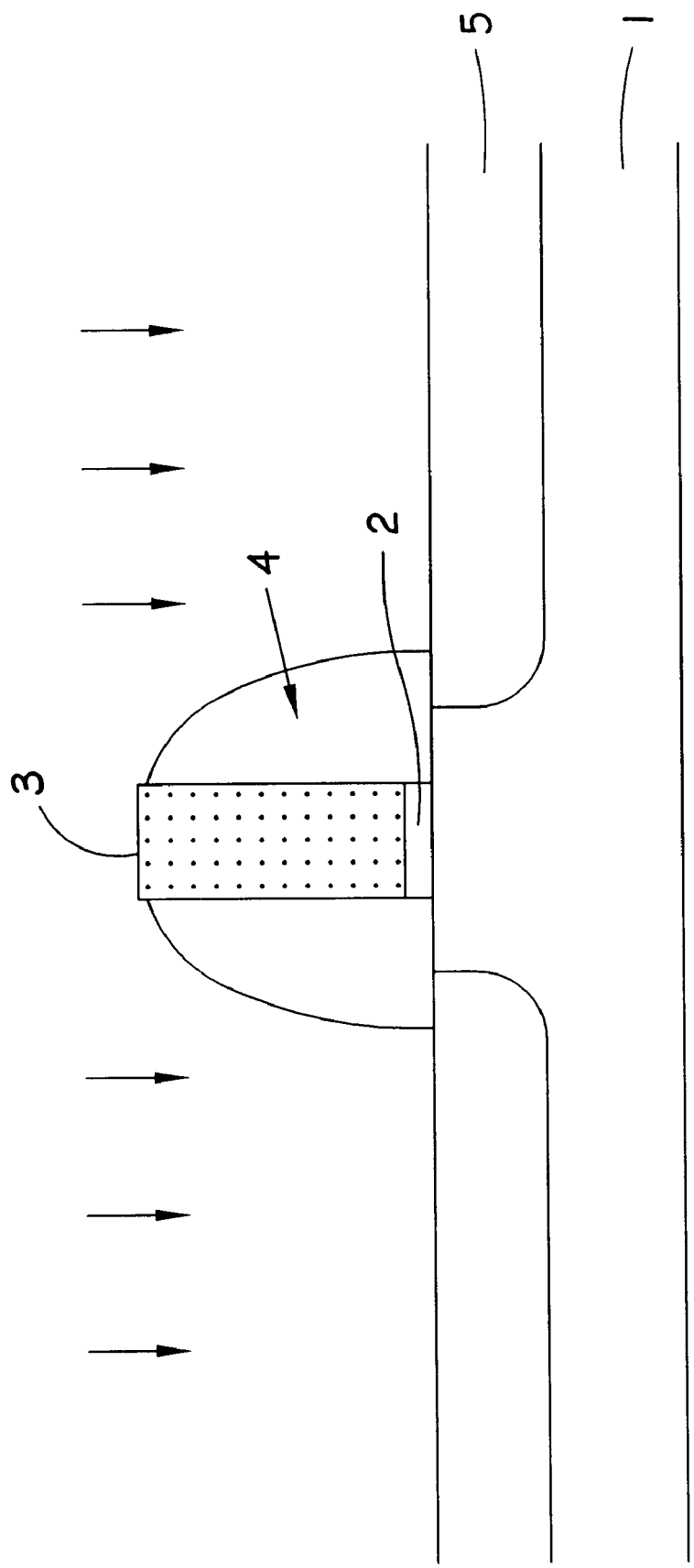
FIG. 1 is a side view in cross-section of a semiconductor chip undergoing deep source/drain implant.
Figure 2:
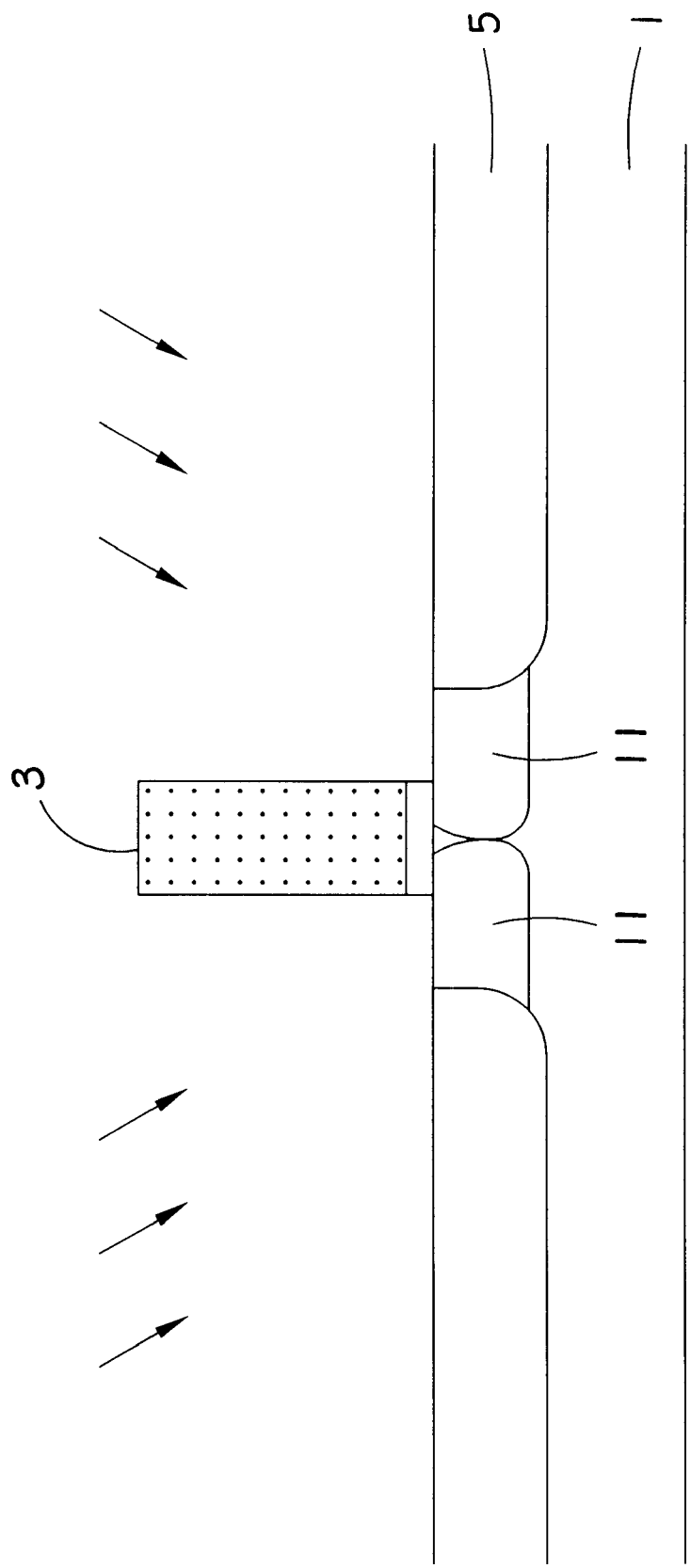
FIG. 2 is a side view in cross-section of the chip of FIG. 1 undergoing a deep halo implant.

Referring first to FIG. 1, a substrate 1 having gate oxide 2, gate 3 and nitride spacer 4 is prepared in the conventional manner. A deep (approximately 40 nm to approximately 100 nm) source/drain implant of ions selected from the group consisting essentially of $B^+$, $BF_2^+$, $As^+$, $Sb^+$, $P^+$, forms source/drain 5. This structure is then annealed at a temperature of approximately 1000° C. to approximately 1050° C. Next, referring to FIG. 2, the nitride spacer 4 is removed, followed by a deep halo implant with a tilt angle of approximately 10° to approximately 60° from the vertical of ions selected from the group consisting essentially of $B^+$, $BF_2^+$, $In^+$, $Ga^+$, $As^+$, $Sb^+$, $P^+$, forming deep (approximately 40 nm to approximately 100 nm) halo regions 11. The chip is then annealed at a temperature of approximately 800° to approximately 900° C.

Figure 3:
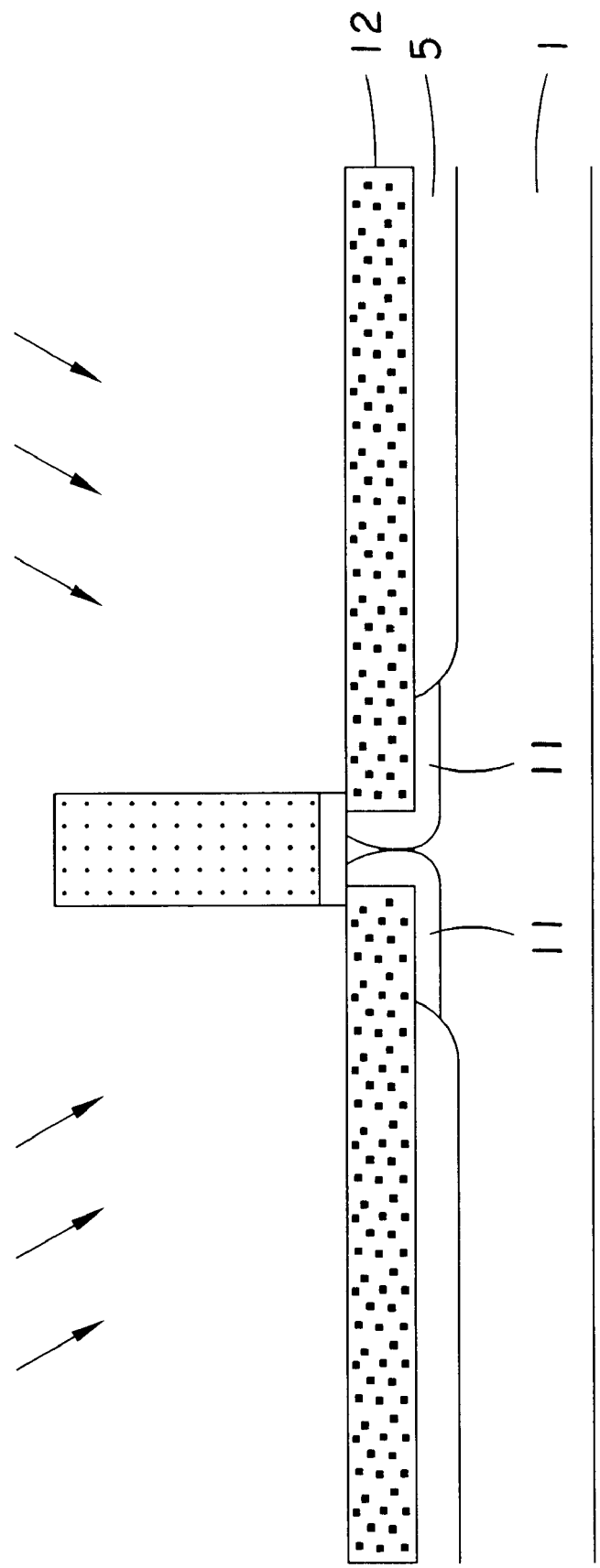
FIG. 3 is a side view in cross-section of the chip of FIG. 2 undergoing an amorphization implant.
Figure 4:
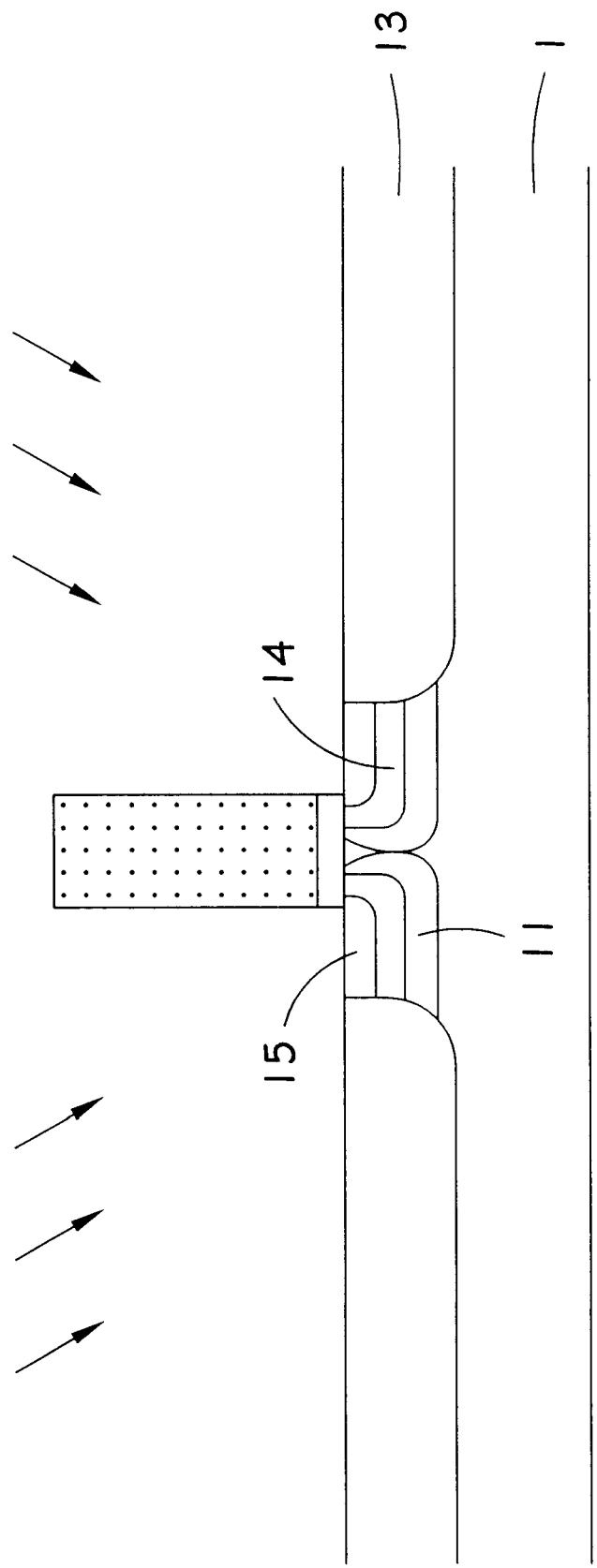
FIG. 4 is a side view in cross-section of the chip of FIG. 3 undergoing a shallow halo implant and source/drain extension implant.

Referring now to FIG. 3, a pre-amorphization implant is then performed, forming amorphized region 12. This implant may be made with silicon, germanium, xenon or the like. As shown in FIG. 4, a second halo implant and source/drain extension implant are then performed. This shallow (approximately 10 nm to approximately 30 nm) halo implant is performed at a tilt angle of approximately 10° to approximately 60°, forming shallow halo region 14 and source/drain extensions 15. The second halo implant may be made with the same or different ion species as the first halo implant. A third anneal is then performed at a temperature of approximately 500° to approximately 600° C., forming recrystallized region 13. The majority of the dopant ions of the second, shallow, halo implant and source/drain extensions is preferably located within the amorphized silicon region 12 and becomes activated during subsequent epitaxy or recrystallation steps.

Figure 5:
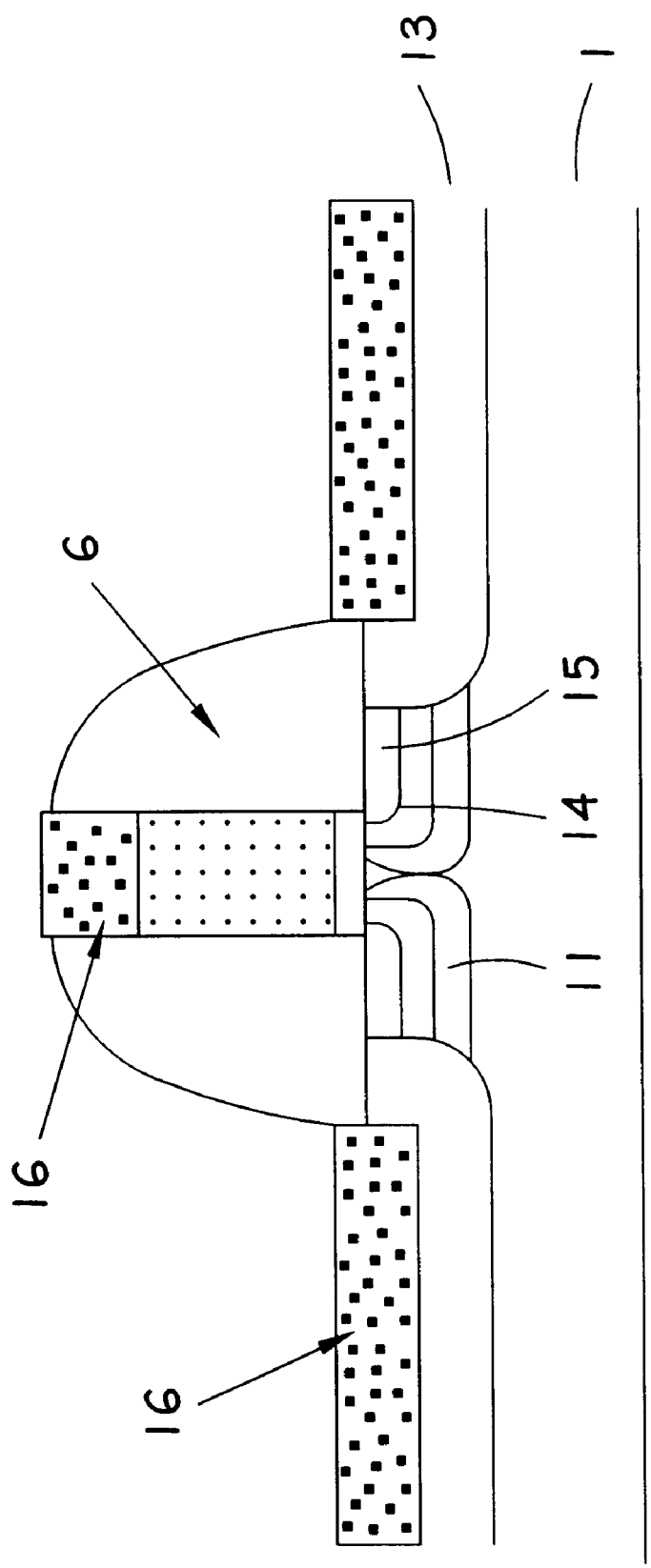
FIG. 5. is a side view in cross-section of the chip of FIG. 4 after silicidization.

Then, referring to FIG. 5, a second spacer 6 of either nitride or oxide is formed on gate 3, followed by forming a silicide 16. The remainder of the MOSFET is then completed in the normal fashion.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of making a MOSFET, comprising:
   providing a substrate having a gate oxide and gate having a nitride spacer thereon, the gate defining a channel region of no more than 50 nm length;
   performing a source/drain implant;
   performing a first anneal;
   removing the nitride spacer;
   performing a first halo implant at an angle of approximately 10° to approximately 60° and at a depth of approximately 40 nm to approximately 100 nm in said channel region;
   performing a second anneal;
   performing a pre-amorphization implant;
   performing a second halo implant at an angle of approximately 10° to approximately 60° and at a depth of approximately 10 nm to approximately 30 nm in said channel region;
   performing a third anneal;
   forming a second spacer on the gate,
   wherein said first and second halo implants improve the threshold voltage roll-off characteristics of the MOSFET; and
   completing the MOSFET.

2. A method, as recited in claim 1, wherein the source/drain implant performing step comprises vertically implanting ions in a depth range of approximately 40 nm to approximately 100 nm.

3. A method, as recited in claim 1, wherein the first halo implant performing step comprises implanting ions selected from a group consisting essentially of $B^+$, $BF_2^+$, $In^+$, $Ga^+$, $As^+$, $Sb^+$, and $P^+$ in a depth range of approximately 40 nm to approximately 100 nm.

4. A method, as recited in claim 1, wherein the second halo implant performing step comprises implanting ions selected from a group consisting essentially of $B^+$, $BF_2^+$, $In^+$, $Ga^+$, $As^+$, $Sb^+$, and $P^+$ in a depth of approximately 10 nm to approximately 30 nm.

5. A method, as recited in claim 1, wherein the first anneal performing step comprises annealing in a temperature range of approximately 1000° C. to approximately 1050° C.

6. A method, as recited in claim 1, wherein the second anneal performing step comprises annealing in a temperature range of approximately 800° C. to approximately 900° C.

7. A method, as recited in claim 1, wherein the third anneal performing step comprises annealing in a temperature range of approximately 500° C. to approximately 600° C.

8. A method, as recited in claim 1, wherein the pre-amorphization implant performing step comprises implanting ions selected from a group consisting essentially of silicon, germanium, and xenon.

9. A method of making a MOSFET, comprising:
   providing a substrate having a gate oxide and a gate having a nitride spacer thereon, the gate defining a channel region of more than 50 nm length;
   performing a source/drain vertical implant to a depth of approximately 40 nm to approximately 100 nm;
   performing a first anneal;
   removing the nitride spacer;
   performing a first halo implant at an angle of approximately 10° to approximately 60° and at a depth of approximately 40 nm to approximately 100 nm in said channel region;
   performing a second anneal;
   performing a pre-amorphization implant to a depth of approximately 10 nm to approximately 30 nm;
   performing a second halo implant at an angle of 10° to approximately 60° and at a depth of approximately 10 nm to approximately 30 nm in said channel region;
   performing a third anneal;
   forming a second spacer on the gate;
   wherein said first and second halo implants improve the threshold voltage roll-off characteristics of the MOSFET; and
   completing the MOSFET.

10. A method, as recited in claim 9, wherein the first halo implant performing step comprises implanting ions selected from a group consisting essentially of $B^+$, $BF_2^+$, $In^+$, $Ga^+$, $As^+$, and $P^+$ in a depth range of approximately 40 nm to approximately 100 nm.

11. A method as recited in claim 9, wherein the second halo implant performing step comprises implanting ions selected from a group consisting essentially of $B^+$, $BF_2^+$, $In^+$, $Ga^+$, $As^+$, $Sb^+$, and $P^+$ in a depth range of approximately 10 nm to approximately 30 nm.

12. A method, as recited in claim 9, wherein the first anneal performing step comprises annealing in a temperature range of approximately 1000° C. to approximately 1050° C.

13. A method, as recited in claim 9, wherein the second anneal performing step comprises annealing in a temperature range of approximately 800° C. to approximately 900° C.

14. A method, as recited in claim 9, wherein the third anneal performing step comprises annealing in a temperature range of approximately 500° C. to approximately 600° C.

15. A method of making a MOSFET, comprising:

providing a substrate having a gate oxide and a gate having a nitride spacer thereon;

performing a vertical source/drain implant in a depth range of approximately 40 nm to approximately 100 nm;

performing a first anneal in a temperature range of approximately 1000° C. to approximately 1050° C.;

removing the nitride spacer;

performing a first halo implant at an angular range of approximately 10° to approximately 60° in a depth range of approximately 40 nm to approximately 100 nm;

performing a second anneal in a temperature range of approximately 800° C. to approximately 900° C.;

performing a pre-amorphization implant with ions selected from a group of ions consisting essentially of silicon, germanium, and xexon;

performing a second halo implant at an angular range of approximately 10° to approximately 60° in a temperature range of approximately 40 nm to approximately 100 nm;

performing a third anneal in a depth range of approximately 500° C. to approximately 600° C.;

forming a second spacer on the gate followed by a silicidization; and completing the MOSFET.

16. A method, as recited in claim 15, wherein the first and second halo implant performing steps each comprise implanting ions selected from a group consisting essentially of $B^+$, $BF_2^+$, $In^+$, $Ga^+$, $As^+$, $Sb^+$, $P^+$.

* * * * *